HERMETIC SEAL FOR PLANAR TRANSISTORS AND METHOD

Filed Dec. 26, 1963

INVENTORS
IRVING AMES
HOLLIS L. CASWELL

BY [signature]

ATTORNEY

United States Patent Office 3,350,222
Patented Oct. 31, 1967

3,350,222
HERMETIC SEAL FOR PLANAR TRANSISTORS AND METHOD

Irving Ames, Peekskill, and Hollis L. Caswell, Mount Kisco, N.Y., assignors to International Business Machines Corporation, New York, N.Y., a corporation of New York Filed Dec. 26, 1963, Ser. No. 333,475
11 Claims. (Cl. 117—212)

ABSTRACT OF THE DISCLOSURE

The present method is used for forming improved thin film devices. The method comprises the steps of depositing a first aluminum oxide coating over a substrate and that portion of a device located on the substrate to which it is not desired to make electrical contact, depositing a layer of conductor material choosen from the group consisting of tungsten and molybdenum in a desired pattern on said first aluminum oxide layer, and depositing a second layer of aluminum oxide over the layer of conductor material wherein the substrate, the tungsten, molybdenum, and aluminum oxide have substantially the same coefficients of thermal expansion. The thin film device formed by this method has been found to provide excellent innerlayer adherence and further exhibits a homogenous coefficient of thermal expansion whereby heat cycling problems due to differential expansion are practically eliminated.

The present invention relates to a method of encapsulating and insulating small components such as transistors. More specifically, it relates to a method for utilizing aluminum oxide layers to achieve improved seals around conductors such as molybdenum or tungsten which may be useful as connectors to elements of planar semiconductor devices.

In the fabrication of transistors, solid state diodes and the like, it is usually necessary to completely encapsulate these devices both to afford physical protection and to prevent atmospheric elements such as moisture and the like from entering the device around protruding connectors and causing premature failure or incorrect operation. Further, in the thin film fabrication art in general, it is necessary to deposit interspersed layers of conductors and insulators on a suitable substrate, whether it be an insulative substrate such as glass or a semiconductor material such as germanium, silicon, gallium arsenide and the like commonly utilized as substrates in integrated circuit technology.In these latter devices it is sometimes necessary to build up three, four or even more interspersed layers of conductors and insulating barriers. It is obvious that with such structures poor adherence or high stresses built up within the structure due either to the method of fabrication or subsequent heat cycling can cause the structures to delaminate, crack or otherwise fail. A common cause of such failures in such areas is that the various layers either do not adhere to a previous layer or crack due to stresses caused either during fabrication or subsequent use of the materials due to different coefficients of thermal expansion. The result is that the various layers crack or peel off. If the peeling or cracking layer is a conductor, obviously electrical continuity of the circuit will be broken and if an insulating layer, either an unwanted short circuit may be occasioned or moisture or other atmospheric contaminating elements may enter the structure which it is desired to protect.

Silicon monoxide (SiO) has long been used for insulating layers in thin film technology and aluminum, gold and similar metals have been used to lay down conducting strips to make circuit contact with the various circuit elements of thin film devices. However, such insulating layers often peel after fabrication. It has long been known that aluminum oxide is a very good insulator, however, it has not been used in the past due to the difficulty of depositing it in the form of thin layers of the type normally used in thin film and related technology.

It has been found that because of the close match in expansion coefficient between aluminum oxide and most semiconductors, layers of this material, if desposited onto semiconductors, provide excellent thermal match and hence are relatively resistant to peeling or cracking. It has been observed furthermore, that such layers form adherent coatings to silicon, germanium and gallium arsenide surfaces. When utilized with conductors such as molybdenum or tungsten which have expansion coefficients close to those of most semiconductor materials, relatively stable layered structures result.

It is accordingly a primary object of the present invention to provide a method of forming superior insulative coatings for use in the thin film and related technologies.

It is a further object to provide such a coating which has excellent resistance to cracking and peeling due to low internal stresses and excellent adhesive properties.

It is another object to provide a method for completely insulating and sealing small electronic devices.

It is yet another object to provide a method for forming compatible composite layers of insulating material and conductor material which will not deteriorate due to differential thermal expansion.

The foregoing and other objects, features and advantages of the invention will be apparent from the following more particular description of preferred embodiments of the invention, as illustrated in the accompanying drawings, in which the embodiments of this invention are illustrated using molybdenum, aluminum oxide and silicon.

The objects of the present invention are accomplished in general by a method for forming an insulating layer and hermetic seal on a thin film component, said component being composed primarily of a substrate having an expansion coefficient between about 3 and $5\times10^{-6}/°$ C.

More particularly, the objects of the invention are accomplished wherein it is desired to make electrical contact to a particular portion of the semiconductor device by means of strip lines formed of materials such as molybdenum or tungsten and wherein it is necessary to surround such lines by an insulative medium which comprises depositing a layer of aluminum oxide on all but areas where it is desired to make subsequent contact, secondly laying down other similar strip lines above the aforementioned by use of an additional layer of aluminum oxide for insulation between conductors, where required.

By utilizing the above principles with certain substrate or base materials such as glass, germanium and silicon, rugged thin film structures can be fabricated utilizing aluminum oxide insulating and encapsulating films and molybdenum strip line conductors. The resulting layers have very similar coefficients of thermal expansion and what is perhaps more important, the aluminum oxide forms extremely adherent films on contact with all of the above mentioned elements. It should further be noted that aluminum oxide is substantially impervious to moisture penetration. Thus, even though certain differences in coefficients of thermal expansion exist, the extreme tenacity of the coating tends to prevent peeling and cracking of the various layers of the device.

Another troublesome area in making such devices in the past has been the seal where the encapsulating or insulating medium adjacent the land or external circuitry contact conventionally provided on such devices tends to pull away from the conductor adjacent to the exposed land area, thus admitting moisture and other atmospheric contaminants. Use of the present system provides a more compatible, mechanically stable, hermetic seal in that region and hence minimizes this problem.

It is to be clearly understood that the teachings of the present invention may be applied to a wide variety of technologies involving the deposition of alternate layers of insulating and conducting mediums, of which the thin film technology is but one example. However, by way of example, a typical thin film device is illustrated in the accompanying drawings and will be described for the purpose of illustrating the present invention.

Figure 1:
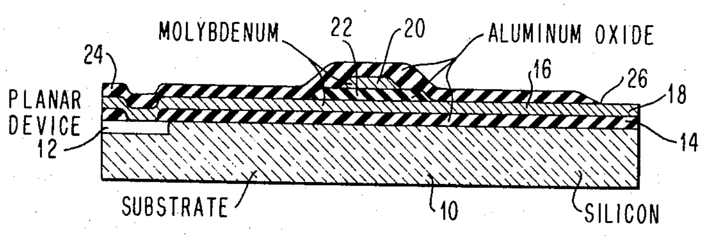
FIGURE 1 is a cross-sectional view of a fragmentary portion of a typical thin film device constructed according to the teachings of the present invention.

Referring now more particularly to the drawings, FIGURE 1 is a cross-sectional view of a thin film device illustrating the various layers of insulating medium, substrate and strip line conductors applied over said substrate. As will be apparent from the broken lines in the drawing, this device is but a small segment of a larger thin film device as might be utilized in integrated circuit techniques. The device shown in FIGURE 1 comprises a substrate 10 composed of silicon or a similar semiconductor material having a planar device 12 formed by diffusion or some other suitable method. This planar device 12 could be a planar transistor, diode or some other planar device as is well known in the semiconductor area. The insulative coatings on the substrate comprise a first coating of aluminum oxide 14 which covers all of the device but the area of the planar device 12 with which it is desired to make contact with the strip line conductor 16. In laying down the first aluminum oxide film 14, the area of the planar device over which it is desired to make the external contact is masked and all of the rest of the surface of the substrate is accordingly coated. Next, the strip line 16 is laid down as is more clearly indicated in the plan view of FIGURE 2 in the dotted lines and next, assuming a transverse conductor is to be laid down on the substrate which intersects the path of the first strip line 16, it will, of course, be obvious that the two conductors must be insulated from one another. To accomplish this, a small aluminum oxide area 22 is laid down at the proposed intersection between the two strip lines 18 and 20. Finally, an insulative coating is laid down over the still exposed top areas of the two strip lines 16 and 20 as indicated by numeral 24. It should be noted that in many cases, it might be desired to coat the entire upper area of the substrate with this top coating rather than just the areas indicated in the figures.

Figure 2:
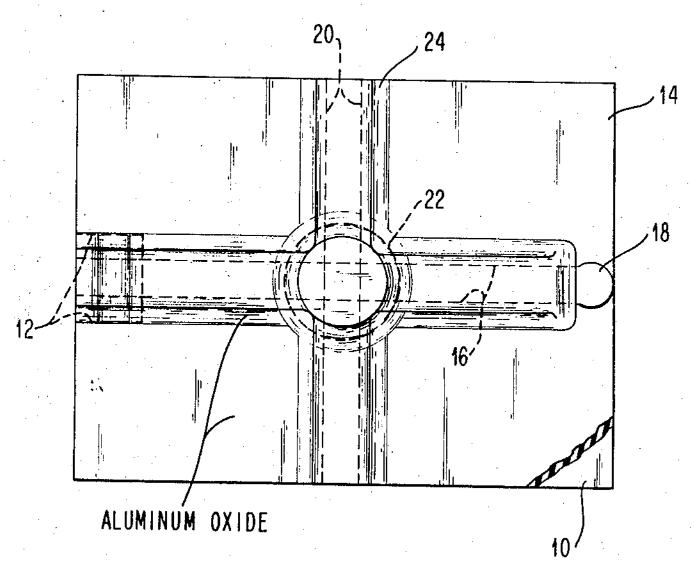
FIGURE 2 is a plan view of the device of FIGURE 1.

The plan view of FIGURE 2 merely illustrates the particular exemplary embodiment of the invention in that the intersection of the two strip lines 16 and 20 which are shown in dotted lines is clearly shown as is the small insulative mask 22. The land 18 which provides external circuit connection to the strip line 16 is clearly shown in this view, and as is well known, contact to these lands may be made by soldering, pressure contact or various other expedients.

The following table illustrates the coefficients of thermal expansion of a number of common materials often utilized in the general area of thin film technology and also those of tungsten, molybdenum and aluminum oxide which comprise the coating conductor system of the present invention.

*Table I*

| Material | Coefficient of thermal expansion in percent elongation per ° C. |
|---|---|
| Silicon | Between 3 and $4\times10^{-6}/°$ C. |
| Tungsten | $4.5\times10^{-6}/°$ C. |
| Molybdenum | $5\times10^{-6}/°$ C. |
| Aluminum | $23\times10^{-6}/°$ C. |
| Gold, copper | Approximately $16\times10^{-6}/°$ C. |
| Aluminum oxide | $3–5\times10^{-6}/°$ C. |
| Common glass | Between 5 and $10\times10^{-6}/°$ C. |

From the table above, it may be seen that aluminum oxide, molybdenum, tungsten, silicon and glass all have coefficients of expansion in the general neighborhood of $5\times10^{-6}/°$ C. It will also be noted that aluminum, copper and gold all of which have been used in the past extensively and almost exclusively for such strip line conductors have coefficients of expansion far in excess of either the glass or silicon dioxide and also alumina. Thus, wherever such a device is subjected to any heat cycling, it will be evident that considerable differential expansion takes place, tending to weaken the resultant structure. By utilizing the combination of molybdenum and aluminum oxide, it is possible to achieve improved resistance to such an effect.

In summation, the aluminum oxide films by themselves have good adhesion to certain materials. The coatings should also have insulative value. Further, when aluminum oxide coatings are combined with molybdenum conductors, a far superior composite device should be obtained than with prior art devices characterized by silicon dioxide and aluminum.

The aluminum oxide coatings may be applied according to the present invention by any number of available techniques such as vapor deposition of aluminum in a high oxygen partial pressure as disclosed in the article by E. Da Silva and P. White in The Journal of the Electrochemical Society, June 1962, page 12, vol. 109, entitled "Electrical Properties of Evaporated Aluminum Oxide Films." An alternative method is by thermal evaporation produced by electron bombardment heating of $Al_2O_3$. A third is by reactive sputtering of aluminum in an oxygen atmosphere. Similarly, the molybdenum or tungsten may be deposited by sputtering or by thermal evaporation techniques.

It should be noted that aluminum oxide films have been extremely difficult to form in the past and that it is only recently that certain techniques such as those enumerated previously have become available. With these methods, it is possible to deposit the film on a base member without actually raising the temperature of the base member to near the melting point of the aluminum oxide which would completely destroy most thin film devices. Similarly, tungsten (W) and molybdenum have not been considered previously as conductors on such devices because their resistance is twice as large as copper, aluminum, gold and the other more common conductor metals, and they are more difficult to deposit in a state in which they display bulk resistivity.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A method of providing conducting leads for thin film devices and insulating same, which comprises:

depositing a first aluminum oxide coating over a substrate and that portion of a device located on the substrate to which it is not desired to make electrical contact, depositing a layer of material chosen from the group consisting of tungsten and molybdenum in a desired pattern on said first aluminum oxide layer, and depositing a second layer of aluminum oxide over the layer of conductor material wherein the substrate, the tungsten, molybdenum and aluminum oxide have substantially the same coefficients of thermal expansion.

2. A method as set forth in claim 1 wherein the aluminum oxide is formed and the layer deposited in a single operation by evaporating aluminum in a high oxygen partial pressure.

3. A method a set forth in claim 1 wherein the aluminum oxide film is deposited by thermal evaporation techniques wherein the aluminum oxide source is initially vaporized by electron bombardment heating and subsequently deposited by condensation upon the device.

4. A method as set forth in claim 1 wherein the aluminum oxide layers are deposited by the reactive sputtering of aluminum in an oxygen atmosphere.

5. A method as set forth in claim 1 wherein the conductor material is deposited by reactive sputtering of the material in a substantial vacuum.

6. A method as set forth in claim 1 wherein the conductor material is deposited upon the device by the thermal evaporation produced by electron bombardment heating of said material.

7. A conductive circuit element comprising:

a substrate, a first layer of aluminum oxide thereon, a layer of conductor material having substantially the same coefficient of thermal expansion as the aluminum oxide and the substrate forming a low resistance current path, and a second layer of aluminum oxide covering all of said conductor material except those portions to which it is desired to make subsequent electrical contact.

8. A conductive circuit element as set forth in claim 7 wherein said conductor material is tungsten.

9. A conductive circuit element as set forth in claim 7 wherein said conductor material is molybdenum.

10. A conductive circuit element as set forth in claim 7 wherein said substrate is silicon and said conductive material is molybdenum.

11. An electrical circuit subassembly comprising:

a silicon substrate, a planar circuit element incorporated in said substrate having an area on the surface of said substrate to which it is desired to make electrical contact, a first layer of aluminum oxide covering all of said substrate except said area, a strip line conductor comprising a layer of molybdenum over said first layer of aluminum oxide in ohmic contact with said area of said planar device, and a second layer of aluminum oxide covering all of said strip line and planar device except those areas to which it is desired to make subsequent electrical contact wherein said substrate, said aluminum oxide layers and said molybdenum conductor have substantially the same coefficients of thermal expansion.

References Cited

UNITED STATES PATENTS 3,169,892 2/1965 Lemelson ---------- 117—212
3,256,588 6/1966 Sikina et al. ------ 117—212 X

FOREIGN PATENTS 900,334 7/1962 Great Britain.

ALFRED L. LEAVITT, *Primary Examiner.*

WILLIAM L. JARVIS, *Examiner.*